United States Patent [19]

Gaebe

[11] Patent Number: 5,737,349

[45] Date of Patent: *Apr. 7, 1998

[54] OPTICAL ISOLATOR AND ALIGNMENT METHOD

[75] Inventor: Carl E. Gaebe, Fleetwood, Pa.

[73] Assignee: Lucent Technologies Inc., Murray Hills, N.J.

[*] Notice: The term of this patent shall not extend beyond the expiration date of Pat. No. 5,113,404.

[21] Appl. No.: 652,289

[22] Filed: May 22, 1996

[51] Int. Cl.$^6$ ................................................. H01S 3/00
[52] U.S. Cl. .................. 372/37; 372/703; 372/106; 372/34; 372/20; 372/107; 372/92
[58] Field of Search ........................... 372/703, 106, 372/98, 105, 107, 37, 92, 34, 20; 350/375; 359/280, 282; 385/11

[56] References Cited

U.S. PATENT DOCUMENTS

| | | | |
|---|---|---|---|
| 4,909,612 | 3/1990 | Scerbak et al. | 350/375 |
| 5,029,953 | 7/1991 | Dexter et al. | 372/703 |
| 5,113,404 | 5/1992 | Gaebe et al. | 372/36 |
| 5,146,361 | 9/1992 | Licht | 359/280 |
| 5,267,077 | 11/1993 | Blonder | 372/703 |
| 5,278,853 | 1/1994 | Shirai et al. | 372/703 |
| 5,345,329 | 9/1994 | Shirai et al. | 372/703 |
| 5,557,692 | 9/1996 | Pan et al. | 385/11 |

*Primary Examiner*—Leon Scott, Jr.

[57] ABSTRACT

An optical isolator comprises an input polarizer configured to pass light at a predetermined optical polarization axis to a Faraday rotator and thereafter through an output polarizer. A magnet is disposed remotely and laterally away from the Faraday rotator, such that the external field of the magnet maintains the magnetization of the Faraday rotator substantially saturated. In accordance with another aspect of the invention the output polarizer is rotatably adjustable to substantially fine tune the isolator to a given laser wavelength. To this end light is transmitted through an input polarizer, and through a Faraday rotator magnetized in a first magnetization direction so as to rotate the polarization axis of the light passing through the Faraday rotator. The output polarizer is rotatably adjusted until such time that substantially no light travels through the output polarizer. The Faraday rotator is then mangentized in a second magnetization direction such that it reverses the rotation of the polarization axis of the light traveling through it. The postion of the output polarizer is then fixed.

13 Claims, 2 Drawing Sheets

OPTICAL ISOLATOR AND ALIGNMENT METHOD

FIELD OF THE INVENTION

The present invention relates to an optical device, and more specifically to an optical isolator subassembly employed in laser modules, and a method for aligning such optical isolator.

BACKGROUND OF THE INVENTION

Many optical devices include a laser module configured to provide a laser light for optical communications purposes. Typically, such laser modules include a transmitter comprising a laser source configured to emit a polarized light. They also preferably include an optical isolator subassembly disposed near the transmitter laser to protect the laser against reflected optical signal radiation. FIG. 1 illustrates an exemplary optical fiber communications system 10, which employs a transmitter 12 that emits light towards an optical isolator 14. One end of a fiber optic 16 is configured to receive the light emitted at the output of isolator 14. The other end of fiber optic 16 is coupled to an optical receiver 18.

In the absence of the optical isolator, light rays traveling along the fiber optic towards the receiver are often reflected or scattered back to the transmitter laser. This reflection, known as optical feedback, substantially degrades the performance of the system. Optical feedback is caused by reflections from discrete optical surfaces, such as those inside laser module 10, and connectors along the fiber path, and also from Rayleigh scattering within the optical fiber itself.

The purpose of isolator 14 is to prevent such reflected and scattered light to directly travel back to the transmitter laser. The operation of optical isolators are well known and described, for instance, by S. Makio et al., *Electronics and Communications in Japan*, Part 2, Vol. 74(2), p. 323 (1991), incorporated herein by reference. Typically, optical isolator 14 comprises a polarizer 20, also referred to as input polarizer, configured to receive light from transmitter 12. A Faraday rotator 22 is disposed next to input polarizer 20 to receive light rays emerging out of it. A second polarizer 24, also referred to as output polarizer, is disposed next to the Faraday rotator. A magnet 26 is provided to surround the Faraday rotator to maintain its magnetization state. A fiber optic 16 carries the light provided by transmitter 12 to a receiver 18. As mentioned, optical isolator 14 substantially prevents back light traveling towards transmitter 12 as explained in more detail below.

During operation, a laser source is configured to emit light to input polarizer 20. The light that passes through input polarizer 20 is polarized along a specific polarization axis. This light then passes through the Faraday rotator, which is a magneto-optic material. The Faraday rotator, which is typically made of Bi-substituted rare earth iron garnets, rotates the polarization axis of the light passed through it by a predetermined angle. The light that has passed through the Faraday rotator travels next through polarizer 24, which is configured to pass only the light that has the same polarization axis as that emerging from the Faraday rotator.

Magneto-optic materials that function as Faraday rotators typically have a predetermined saturation magnetization, which requires the use of a relatively large, high field permanent magnet (e.g., SmCo). Such magneto-optic materials generally have magnetic domains, which change their domain structure and alignment upon application of a substantially strong magnetic field. In particular, in a field greater than or equal to the saturation field of the magneto-optic material, the magnetic domain is substantially along the same axis, with magnetization oriented along the direction of the applied field. When light passes through the magneto-optic material, it experiences an angular rotation of its polarization axis at a predetermined angle. This angle of rotation is the same for light traveling transversely from one side of the magneto-optic material to its other side. The angle of rotation depends on the length of the magneto-optic material, its magnetic properties, its temperature, and the wavelength of the light passing through it. For an optical isolator, these properties are configured so that the light passing through the magneto-optic material experiences preferably a 45° rotation.

The optical isolator's performance is measured by the loss or attenuation affected on the return light. Typically, to prevent back-reflected light from having a substantial effect on the transmitter performance, the return loss should normally be in the order of 35 dB or greater.

One disadvantage with prior art optical isolator assemblies is the problem associated with the use of substantially heavy magnets to maintain the magnetization of the Faraday rotator. Typically, the laser transmitter, and the optical isolator subassembly, including the magnet employed by the Faraday rotator, rest on a thermo-electric cooler configured to maintain the operating temperatures of the optical components at a substantially constant degree. However, such thermo-electric cooler are fragile, and may crack or break in response to a mechanical shock, such as a fall or a sudden vibration.

Recently, an optical laser module has been proposed and described in U.S. Pat. No. 5,113,404, issued to Gaebe, et al. ("the '404 patent"), which relieves the thermo-electric cooler from the weight of the magnet. FIG. 2 illustrates the laser module assembly, which employs an optical isolator as will be explained in more detail hereinafter. A silicon based optical submount 32 is configured to hold optical devices, including a laser source 34, a spherical lens 36, a polarizer 40, also referred to as input polarizer, a Faraday rotator 42, and a polarizer 44, also referred to as output polarizer. A thermo-electric cooler (TEC) 46 is configured to support a side portion of submount 32 in proximity to laser 34 and isolator optics components 40, 42, and 44. TEC 46 functions primarily to regulate the operating temperature of laser 34 and Faraday rotator 42, respectively. As illustrated in FIG. 2, TEC 46 is configured to provide a cantilever arrangement.

Thereafter, permanent magnet 38 is slid over the subassembly and positioned to surround isolator optics components, without touching substrate 32. Both magnet 38 and TEC 46 rest on a support base 30, which is the base wall of an enclosure housing or package body that may be employed to contain the components described above. As a result of the arrangement illustrated in FIG. 2, magnet 38 does not rest on TEC 46. Although, the '404 patent overcomes certain disadvantages associated with the use of permanent magnets in optical isolators, it still presents some disadvantages of its own. For example, the process of sliding the submount through the permanent magnet may be relatively lengthy and cumbersome, leading to high production costs.

Another disadvantage of prior art optical isolators is the inability to tune the isolator for its peak performance. Optical isolators are typically tuned for a specific laser with a predetermined light wavelength. Frequently, laser sources that are intended to have the same optical characteristics exhibit significant variations from one unit to the other. For example, the wavelength of laser sources configured to generate a light at a specific wavelength, may deviate significantly from one production batch to the other. As a result, the optical isolator designed for a particular wavelength fails to function as expected, because of such wavelength deviations from laser to laser. For example, an optical isolator that is intended to provide a given feedback attenuation may exhibit a smaller attenuation because of the variation in the laser wavelength.

Thus, there is a need for a laser module assembly that includes an optical isolator that can be used effectively with laser sources that emit light at different wavelengths, without the disadvantages mentioned above.

SUMMARY OF THE INVENTION

Briefly in accordance with one aspect of the invention, an optical isolator comprises: an input polarizer configured to pass light at a predetermined optical polarization axis; a Faraday rotator configured to receive the light passed through said input polarizer; an output polarizer configured to receive light passed through the Faraday rotator; a magnet disposed remotely and laterally away from the Faraday rotator, such that the external field of the magnet maintains the magnetization of the Faraday rotator substantially saturated.

Briefly, in accordance with another aspect of the invention a laser module including an optical isolator, comprises: a housing unit comprising a base wall and a front wall; an input polarizer secured to the base wall, and configured to pass light at a predetermined optical polarization axis; a Faraday rotator secured to the base wall, and configured to receive light passed through the input polarizer; an output polarizer configured to receive light passed through the Faraday rotator; a magnet disposed on the front wall such that the external field of the magnet maintains the magnetization of the Faraday rotator substantially saturated.

Briefly, in accordance with still another aspect of the invention a method for aligning an optical isolator comprises the steps of: transmitting light from a laser source through an input polarizer; transmitting the light from the input polarizer through a Faraday rotator magnetized in a first magnetization direction so as to rotate the polarization axis of the light passing through said Faraday rotator; rotatably adjusting an output polarizer configured to receive the light traveling through the Faraday rotator until such time that substantially no light travels through the output polarizer; and reverse magnetizing the Faraday rotator in a second magnetization direction such that the Faraday rotator reverses the rotation of the polarization axis of the light traveling through the Faraday rotator.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

Figure 1:
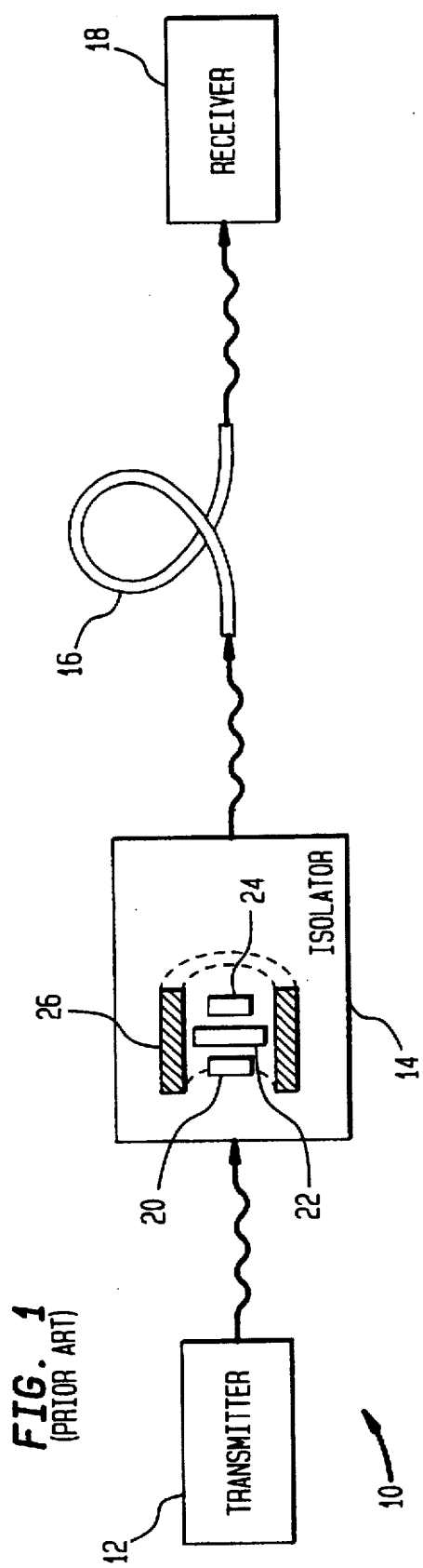
FIG. 1 is an exemplary embodiment of a prior art communication system employing an optical isolator.
Figure 2:
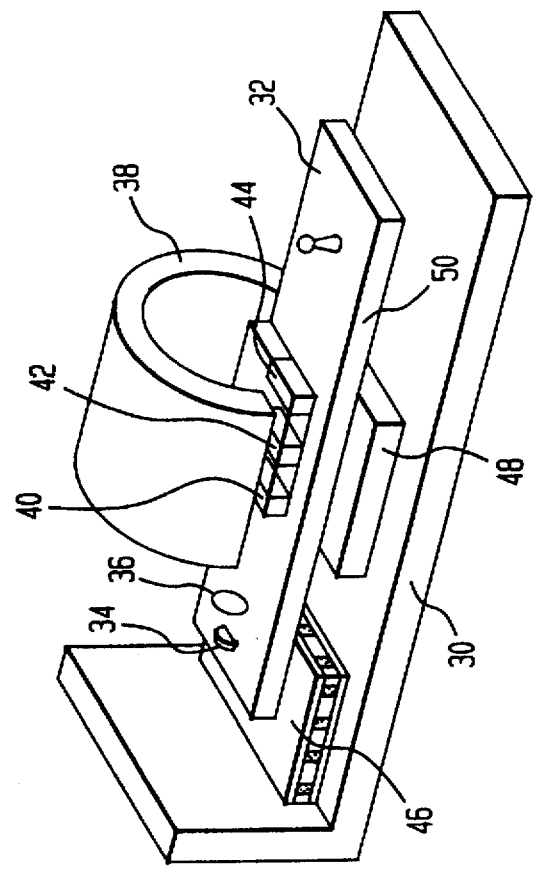
FIG. 2 is another exemplary embodiment of a laser module assembly employing a prior art optical isolator.
Figure 3:
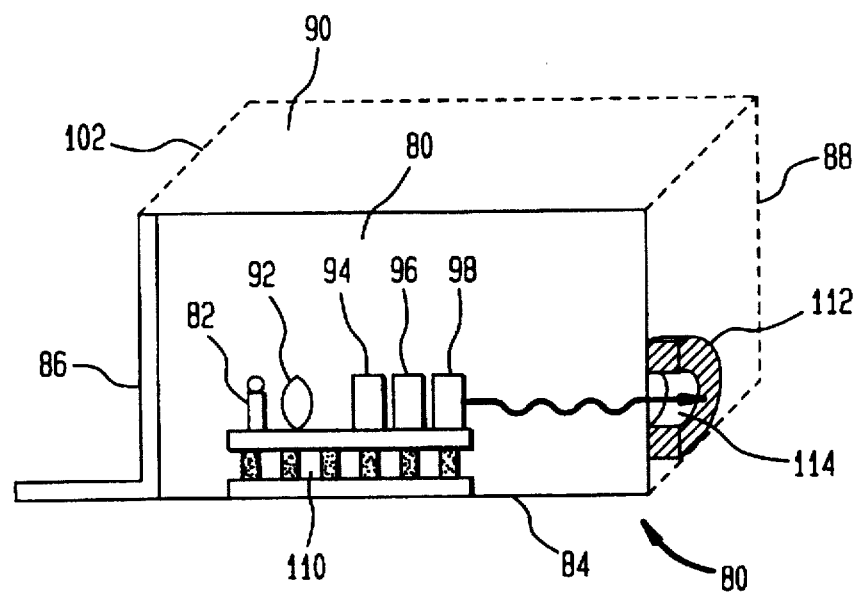
FIG. 3 is a laser module assembly in accordance with one embodiment of the present invention.

FIG. 3 illustrates a laser module assembly 80 in accordance with one embodiment of the present invention, although the invention is not limited in scope to this embodiment. Laser module assembly 80 advantageously comprises a housing unit 102, also termed a package body, that is configured to contain optical components for transmitting light rays generated by a laser source 82. Housing unit 102 preferably includes a base wall 84, a ceiling wall 90, a back wall 86, a front wall 88, a side wall 80, and another side wall (not shown). A thermo-electric cooler (TEC) 110 is disposed on base wall 84, for example, by a welding or bonding process. TEC 110 is configured to securely hold laser source 82, a spherical lens 92, an input polarizer 94, a Faraday rotator 96, and an output polarizer 98.

In order to function properly, the magnetization of the Faraday material must remain saturated. In one embodiment of the present invention, Faraday rotator 96 is made of a magneto-optic material, also known as garnet, that has a low saturation magnetization, for example, in the order of about 100–300 Gauss. Such magneto-optic material is commercially available from Lucent Technologies, Inc. N.J. or from Sumitomo Corp. of America, N.Y. N.Y.

In accordance with the present embodiment of the invention, instead of surrounding the Faraday material with a permanent magnet to maintain its magnetization saturated, a magnet 112 is disposed remotely and laterally from Faraday rotator 96. Magnet 112, which is advantageously formed in the shape of an annular disc or a donut, allows the Faraday rotator to remain in a saturated magnetization state. To this end, magnet 112 is located a predetermined distance from Faraday rotator 96 such that its external magnetic field maintains the desired magnetization within the Faraday rotator. In a preferred embodiment of the invention the dimensions of the Faraday rotator is approximately 1 mm×1 mm×0.4 mm, and the volume of the external magnetic field of magnet 112 at a distance where the external magnetic field is substantially large, is about 1 mm$^3$. Thus, when magnet 112, in accordance with the present invention, is disposed at an appropriate distance away from the Faraday rotator, it is still possible to maintain the magnetic saturation within the Faraday rotator.

In accordance with one embodiment of the present invention, front wall 88 is configured so that it includes an open window 114 for allowing the light, emerging out of output polarizer 98, to travel outside the housing 102. It is noted that although in the present embodiment, magnet 112 is disposed on the front wall of the housing unit, the invention is not limited in scope in that respect. For example, magnet 112 may be disposed in another location of the housing, attached to one of its walls. Magnet 112 may also be disposed inside the housing unit in the vicinity of the Faraday material.

Because the magnet does not rest on the thermo-electric cooler, the laser module assembly exhibits an improved mechanical and thermal stability. For example, as mentioned before, when a magnet rests on the thermo-electric cooler in accordance with prior art laser modules, a sudden vibration or shock on the laser module may cause the thermo-electric cooler to break or crack.

In addition, with the magnet resting on it, the thermo-electric cooler also controls the temperature of the magnet which has a relatively large mass. Controlling the temperature of the magnet, among other things, degrades the thermal performance of the laser module assembly. For example, it is more difficult for the thermo-electric cooler to maintain the temperature of the isolator assembly including the magnet at a constant value. Thus, the components of the optical isolator and the laser source may experience a substantial range of temperature variation in response to the temperature changes of the package body. Typically, when laser source 102 and Faraday rotator 96 experience temperature variations, the isolation performance of the assembly degrades.

Furthermore, because the magnet does not surround the Faraday rotator, it is not necessary to slide an optical assembly through the magnet; a task that leads to delay and increased manufacturing and production cost.

Figure 4:
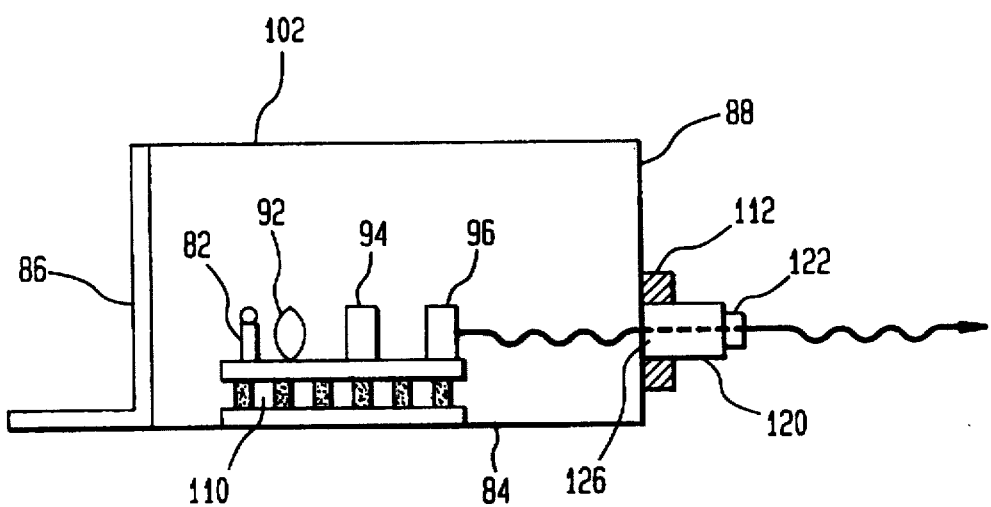
FIG. 4 is a laser module assembly in accordance with another embodiment of the present invention.

FIG. 4 illustrates a laser module assembly in accordance with another embodiment of the invention, which employs a distributed isolator, although the invention is not limited in scope to this embodiment. Housing unit 102 is configured to contain the same components as those described in reference with FIG. 3, except that output polarizer 98 does not rest on thermo-electric cooler 110. To this end, housing unit 102, in accordance with this embodiment of the invention, as illustrated by FIG. 4, includes only a portion of an isolator assembly. This portion, identified as "semi-isolator" includes input polarizer 94 and Faraday rotator 96. Thermoelectric cooler (TEC) 110 is disposed on base wall 84, for example, by a welding or bonding process. TEC 110 is configured to securely hold laser source 82, spherical lens 92, and the semi-isolator comprising input polarizer 94, and Faraday rotator 96.

Magnet 112 is disposed remotely and laterally from Faraday rotator 96. Magnet 112, which is advantageously made in a shape of an annular disc or donut, allows the Faraday rotator to remain in a saturated magnetization state. To this end, magnet 112 is located at a predetermined distance away from Faraday rotator 96 such that its external magnetic field maintains the desired magnetization in Faraday rotator 96.

In accordance with one embodiment of the present invention, front wall 88 is configured so that it includes an open window 126 for allowing the light to emerge out of Faraday rotator 96 and to travel outside housing unit 102. It is noted that although in the present embodiment, magnet 112 is disposed on the front wall of the housing unit, the invention is not limited in scope in that respect. For example, magnet 112 may be disposed in another location of the housing attached to one of the walls. Magnet 112 may also be disposed inside the housing unit in the vicinity of the Faraday material.

A tube 120 made of a rigid material is advantageously disposed on the front wall of housing unit 102, and is aligned co-axially with window 126, at one of its ends, so that the light emerging out of window 126 travels through tube 120. Magnet 112 is preferably configured to rest on tube 120. At the other end of tube 120 rests an output polarizer 122, also termed analyzer 122, which is aligned co-axially with window 126 and tube 120. Output polarizer 122 is rotationally adjustable. The arrangement illustrated in FIG. 4 enhances the isolation performance as will be explained in more detail hereinafter.

As mentioned earlier, prior art isolator assemblies are typically tuned to a predetermined laser wavelength. However, because the light emitted from laser sources exhibit slight wavelength variations, an isolator that is particularly tuned to a specific wavelength does not perform at its peak capacity, leading to a reduced isolation. In accordance with one embodiment of the present invention, it is possible to adjust the isolation performance for a given light wavelength by following the tuning steps described hereinafter.

Initially, the magnetization field in the Faraday rotator is reversed, for example, by pulling out magnet 112 from tube 120 and reversibly inserting it back in its place over tube 120. To this end, the initial magnetization field in the Faraday rotator is advantageously known, although the invention is not limited in scope in that respect. For example, in an alternative embodiment of the invention, as will be explained in more detail, the initial magnetization field in the Faraday rotator may not be known. In any event, the reversal of magnetization field in Faraday rotator 96 reverses the sense of rotation of polarized light passing through the Faraday rotator. This allows output polarizer 122 to be tuned for extinction in the forward direction. To this end, while laser source 82 is emitting a light at a given wavelength, output polarizer 122 is rotated until substantially none of the light emitting out of Faraday rotator through tube 120 exits through the output polarizer. Thereafter, the adjusted position of output polarizer 122 is fixed to tube 120, for example by a bonding process. After the position of output polarizer 122 is fixed, the magnetization of Faraday rotator 96 is switched back to it original direction, by pulling out magnet 112 again and reversibly inserting it back in its place over tube 120.

In an alternative embodiment in accordance with the present invention, the method of aligning the isolator begins by first rotatably adjusting the position of the output polarizer without first determining the magnetization state within the Faraday rotator. The output analyzer is adjusted until substantially no light travels through it. Thereafter the magnetization state within the Faraday rotator is reversed, for normal operation of the laser module.

The above-described method of aligning output polarizer 122 places the peak isolation substantially at the emission wavelength. Meanwhile, the thermo-electric cooler holds the temperature of the Faraday material at a predetermined value. The resulting isolation is approximately 40 dB over external temperatures of −40° C. to 75° C.

In an alternative embodiment of the present invention, Faraday rotator 96 is made of a special material known as "latching garnet." The composition of latching garnet material is described in, for example, U.S. patent application Ser. No. 08/498,099, filed on Jul. 5, 1995, assigned to the same assignees as the present invention. Other references that refer to the characteristics of latching garnets include, for example, K. Matsuda, et al., *Applied Physics Letters* Vol. 59 (5), p. 507 (1991); V. J. Fratello, S. J. Licht, C. D. Brandle, *Innovative Improvements in Bismuth Doped Rare-Earth Iron Garnet Faraday Rotators* IEEE Transactions Magnetics (scheduled for publication in November 1996).

Briefly, a Faraday rotator made of a latching garnet maintains a saturated magnetization without the need of a continuous external magnetic field. A magnetic field of sufficient magnitude is temporarily applied to the latching garnet so as to align its magnetic domain in one direction. The latching garnet maintains its magnetization for a substantially long period of time without the need of an external magnetic field. This magnetization domain may be reversed by temporarily applying a magnetic field in the reverse direction and of sufficient magnitude to align the magnetization domain in the opposite direction. Such latching garnets exhibit stable magnetization over extended periods, for example, months, even in the presence of stray fields of significant magnitude.

In the alternative embodiment that employs a Faraday rotator made of latching garnets, there is no need to dispose magnet 112 in the vicinity of the Faraday rotator. In order to adjust the isolator assembly, a magnetic field is temporarily applied to the latching garnet to reverse its magnetization domain. Thereafter as described in reference with FIG. 4, output polarizer 122 is adjustably rotated until substantially no light emerges out of the polarizer. The position of output polarizer 122 is then fixed. Thereafter, a second magnetic field in the reverse direction is temporarily applied to the latching garnet to reverse its magnetization domain back to its original alignment. This results in peak isolation characteristics for a laser source emitting a light at a given wavelength.

It is noted that the invention is not limited in scope to the position of output polarizer 122 as illustrated in FIG. 4. For example, polarizer 122 may be advantageously disposed anywhere along the traveling direction of the light emitted by laser source 82, as long as it could be rotationally adjusted for forward extinction. Furthermore, although the embodiments described above employ a thermo-electric cooler, it is noted that optical isolators in accordance with the principles of the present invention may also operate without the use of a thermo-electric cooler. In that event, the isolator's components may be secured to a base unit, and a magnet may be disposed remotely from the Faraday rotator. It is also noted that in accordance with another embodiment of the invention, the use of input polarizer 94 may not be necessary, if a laser source having substantially good polarization characteristics is employed. In accordance with such an embodiment of the invention, the laser source advantageously provides polarized light directly to a Faraday rotator.

Thus, embodiments of isolator and semi-isolator assemblies in accordance with the present invention address the problems associated with prior art isolator assemblies, such as substantial difficulties with mechanical and thermal performance and increased production costs for sliding optical assemblies through magnets. Other disadvantages overcome by the present invention include the ability to adjust the characteristics of the isolator assembly to achieve substantially peak isolation for a variety of laser wavelengths.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

I claim:

1. A method for aligning an optical isolator comprising the steps of:

transmitting a light from a laser source along a light emitting axis through a Faraday rotator magnetized in a first magnetization direction so as to rotate the polarization axis of said light transmitted from said laser source;

rotatably adjusting an output polarizer structured and arranged to receive said light traveling through said Faraday rotator until such time that substantially no light travels through said output polarizer; and providing a magnet having an external magnetic field, said magnet structured and arranged so as to be longitudinally spaced from said Faraday rotator along said light emitting axis and so that said Faraday rotator is magnetized in a second magnetization direction such that said Faraday rotator reverses the rotation of said light traveling through said Faraday rotator.

2. The method in accordance with step 1 wherein said step of transmitting further comprises the step of transmitting light from said laser source through an input polarizer.

3. The method in accordance with claim 2 further comprising the step of fixing the position of said output polarizer after said step of adjusting.

4. A laser module including an optical isolator, said laser module comprising:

a laser source for emitting a light signal along a light emitting axis;

a lens mounted proximate to said laser source and along said light emitting axis for receiving light emitted from said laser source;

an input polarizer mounted proximate to said lens and along said light emitting axis for polarizing light provided by said laser source and for producing polarized light;

a Faraday rotator mounted proximate to said input polarizer and along said light emitting axis, said Faraday rotator structured and arranged for receiving said polarized light; and a magnet, having an external magnetic field, said magnet structured and arranged so as to be longitudinally spaced from said Faraday rotator along said light emitting axis and proximate said Faraday rotator so that said external magnetic field of said magnet maintains said Faraday rotator in a substantially saturated magnetic state.

5. The laser module in accordance with claim 4, further comprising a thermo-electric cooler wherein said Faraday rotator is disposed on said thermo-electric cooler.

6. The laser module in accordance with claim 5, wherein said thermo-electric cooler is mounted on said base wall of said housing unit.

7. The laser module in accordance with claim 5, wherein said front wall is provided with a window portion so that light emitted from said laser source exits from said front wall through said window.

8. The laser module in accordance with claim 7, further comprising a pass though tube mounted to said window, so that said light exiting from said front wall travels through said pass through tube.

9. The laser module in accordance with claim 8, wherein said magnet is mounted on said pass through tube and said output polarizer rotatably attached to said pass through tube, said output polarizer is structured and arranged to rotate so as to tune said laser module.

10. The laser module in accordance with claim 4, further comprising an output polarizer mounted proximate said Faraday rotator, wherein said output polarizer is rotatably adjustable.

11. The laser module in accordance with claim 4, wherein said Faraday rotator has a saturation field and wherein said saturation field of said Faraday rotator is approximately about 100–300 Gauss.

12. The laser module in accordance with claim 4, further comprising a housing unit having a base wall and a front wall, wherein said magnet is mounted on said front wall of said housing.

13. The laser module in accordance with claim 4, wherein said Faraday rotator is fabricated from a latching garnet material.

\* \* \* \* \*